(12) United States Patent
Browne et al.

(10) Patent No.: US 8,853,916 B2
(45) Date of Patent: Oct. 7, 2014

(54) RECONFIGURABLE BI-STABLE DEVICE

(75) Inventors: Alan L. Browne, Grosse Pointe, MI (US); Nancy L. Johnson, Northville, MI (US); Geoffrey P. McKnight, Los Angeles, CA (US); Andrew C. Keefe, Encino, CA (US); Guillermo A. Herrera, Winnetka, CA (US)

(73) Assignee: GM Global Technology Operations LLC, Detroit, MI (US)

(*) Notice: Subject to any disclaimer, the term of this patent is extended or adjusted under 35 U.S.C. 154(b) by 249 days.

(21) Appl. No.: 13/250,317

(22) Filed: Sep. 30, 2011

(65) Prior Publication Data

US 2013/0081933 A1    Apr. 4, 2013

(51) Int. Cl.
 *H01L 41/09* (2006.01)
 *G05G 5/06* (2006.01)
 *G05G 1/02* (2006.01)
 *H01H 5/30* (2006.01)

(52) U.S. Cl.
 CPC .. *G05G 1/02* (2013.01); *G05G 5/06* (2013.01); *H01L 41/0926* (2013.01); *H01H 5/30* (2013.01)
 USPC .......................................... 310/328; 310/332

(58) Field of Classification Search
 USPC .......................................... 310/328, 330–332
 See application file for complete search history.

(56) References Cited

U.S. PATENT DOCUMENTS

| 4,601,413 | A | 7/1986 | Krawagna |
| 6,141,831 | A | 11/2000 | Novin et al. |
| 6,356,007 | B1 * | 3/2002 | Silva ............................. 310/331 |
| 7,449,815 | B2 * | 11/2008 | Sasaki ...................... 310/323.09 |
| 7,737,608 | B2 * | 6/2010 | Ruggeri et al. ............... 310/339 |
| 2006/0201149 | A1 | 9/2006 | Biggs et al. |
| 2008/0157631 | A1 * | 7/2008 | Heim et al. ................... 310/330 |

* cited by examiner

*Primary Examiner* — Derek Rosenau
(74) *Attorney, Agent, or Firm* — Cantor Colburn LLP (57) ABSTRACT

A reconfigurable bi-stable device includes an elastically deformable panel laterally disposed between and connected to one or more mounting members directly or indirectly connected to opposing ends of the panel, with the panel maintained under compressive force along at least one vector extending between the opposing ends. The compressive force deforms the panel into a one of two stable deformed positions, with the device disposed such that the panel may be moved between each of the two stable deformed positions by application of manual force to one of two opposing faces of the panel. A first shape memory alloy (SMA) or piezo actuator member is connected to the panel, the actuator member being capable of moving the panel from a first one of the two stable deformed positions to a second one of the two stable deformed positions.

10 Claims, 6 Drawing Sheets

RECONFIGURABLE BI-STABLE DEVICE

FIELD OF THE INVENTION

Exemplary embodiments of the invention are related to deformable bi-stable devices and, more specifically, to reconfigurable bi-stable devices useful for user input applications.

BACKGROUND

User input devices such as push-buttons are commonly used in many devices. Computers, telephones, and vehicle control panels are just a few of the numerous applications requiring some sort of user input. Many such user input devices are in the form of simple switches where activating the switch will send an electrical signal corresponding to the function assigned to the user input device. Such switches typically maintain a fixed position at all times other than during the act of being actuated. For example, the switch's default position may be an 'out' position. Depression of the switch to an 'in' position closes or opens an electromechanical microswitch in a circuit, sending an electrical signal to a controller. After the switch is released, it returns to the 'out' position until it is depressed again. Such switches are commonly used for push-button applications where actuation of the switch will always have the same effect, e.g., computer keyboards and the like.

Other switches may be used, for example, to toggle a device between two different states, such as on and off. For example, a vehicle rear window defroster control switch may be depressed once to turn the defroster circuit on, and then a second time to turn the defroster circuit off. For such switches, it is often desirable to provide a visual or tactile cue to the user of the state of the device. A backlight indicator may be used if only a visual cue is desired. Providing a tactile cue, however, can be more challenging. In a case where the device will remain on indefinitely until turned off by the user (e.g., by pressing the switch again), a simple mechanical retention mechanism may be used to retain the switch in the 'in' position after it is pressed once to activate a device, and then release the switch back to its 'out' position when the switch is depressed again. Such retention mechanisms are well-known, such as commonly found on retractable ball point pens. A simple mechanical retention device, however, is not suitable for providing a visual and tactile cue of a device's operational state if the operational state of the device can be changed by inputs other than operator actuation, such as by a controller based on elapsed time, or temperature, or any of a number of other parameters. Electromechanical and/or electromagnetic devices such as solenoids can be used to reposition a switch based on system input from a controller. Such devices, however, can be unreliable, heavy, expensive to manufacture, and/or have excessive space requirements, and they tend to be limited in the number of different positions they can be repositioned to. Accordingly, there remains a need for devices that can be controllably reconfigured to different positions.

SUMMARY OF THE INVENTION

In one exemplary embodiment, a reconfigurable bi-stable device includes an elastically deformable panel laterally disposed between and connected to one or more mounting members directly or indirectly connected to opposing ends of the panel, with the panel maintained under compressive force along at least one vector extending between the opposing ends. The compressive force deforms the panel into a one of two stable deformed positions, with the device disposed such that the panel may be moved between each of the two stable deformed positions by application of manual force to one of two opposing faces of the panel. A first shape memory alloy (SMA) or piezo actuator member is connected to the panel, the actuator member being capable of moving the panel from a first one of the two stable deformed positions to a second one of the two stable deformed positions.

In another exemplary embodiment, there is a method of operating a bi-stable device that includes an elastically deformable panel laterally disposed between and connected to one or more mounting members directly or indirectly connected to opposing ends of the panel, with the panel maintained under compressive force along at least one vector extending between the opposing ends of the panel with the compressive force deforming the panel into a one of two stable deformed positions, and a first SMA or piezo actuator member connected to the panel. The method includes applying heat or electric current to the first SMA or an electric field to the piezo actuator member to move the panel from a first one of the two stable deformed positions to a second one of the two stable deformed positions. In yet another exemplary embodiment, the method optionally includes applying manual force to the panel to move the panel from the second of the two stable deformed positions to the first of the two stable deformed positions.

The above features and advantages, and other features and advantages of the invention are readily apparent from the following detailed description of the invention when taken in connection with the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

DESCRIPTION OF THE EMBODIMENTS

The following description is merely exemplary in nature and is not intended to limit the present disclosure, its application or uses. It should be understood that throughout the drawings, corresponding reference numerals indicate like or corresponding parts and features.

Figure 1A:
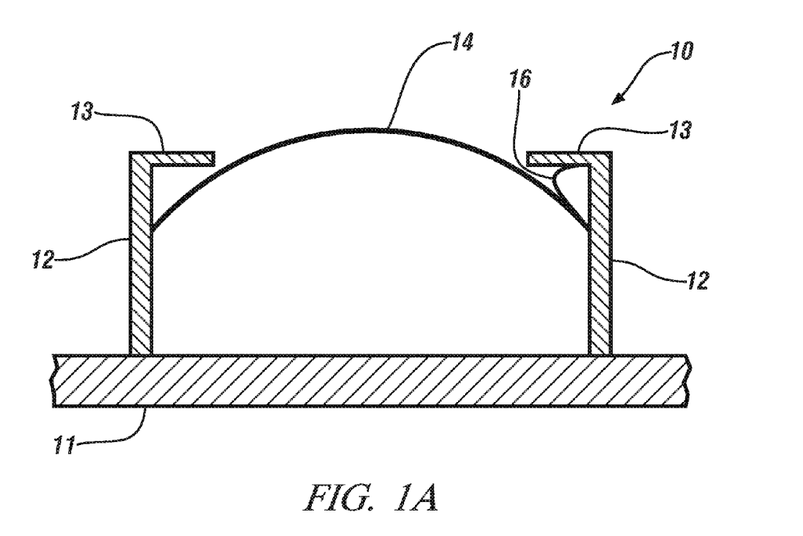
FIGS. 1A and 1B depict a schematic diagram of an exemplary bi-stable device having a circular deformable panel with an SMA actuator member capable of moving the panel from a second position to a first position.
Figure 1B:
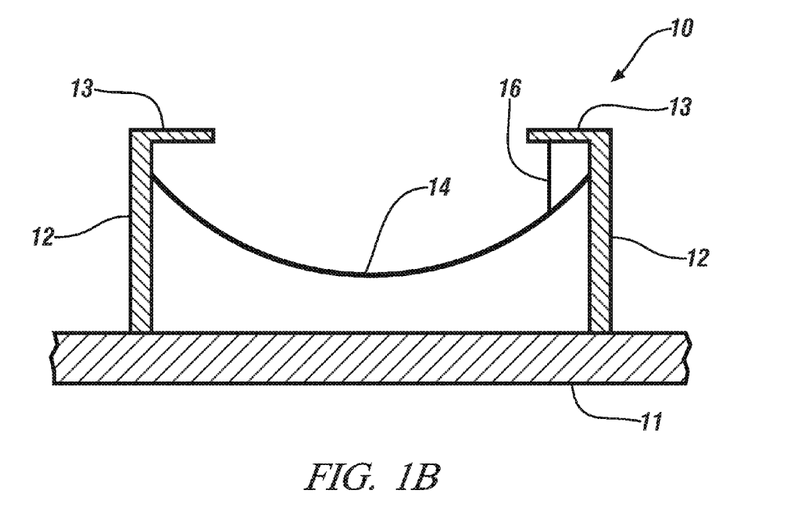

Turning now to the Figures, FIGS. 1A and 1B depict a schematic diagram of an exemplary reconfigurable bi-stable device 10 having a deformable panel with an SMA actuator member capable of moving the panel from a second position to a first position. In FIGS. 1A and 1B, a cylindrical mounting member 12 having an upper lip portion 13 is mounted on a support structure 11. An elastically deformable panel 14, which may be circular but may also be other shapes like rectangular, is attached to the inner circumference of the mounting member. The panel may be circular The stiffness of the panel 14 should be such that it can elastically deform between the positions shown in FIGS. 1A and 1B with the application of a desired amount of force. The material for the elastically deformable panel may be any material having a modulus of elasticity so that it provides the desired stiffness for the particular device design parameters (e.g., length and cross-sectional area, length-width-thickness, surface area and cross-sectional area). Suitable materials may include metals such as steel and steel alloys, aluminum, phosphor-bronze, beryllium-copper, spring (blue-temper) steels, brass, and bronze and hardened and tempered versions of the above, thermoplastics such as any of the above-described thermoplastics and/or shape memory polymers, and thermoset resins such as epoxies, cross-linked acrylics, cross-linked urethanes, and the like.

The elastically deformable panel would have a normally flat state, but is sized to have a diameter (or length and width in the case of a rectangular panel) in its normal flat state that is greater than the internal diameter of the mounting member 12 so that when it is mounted in the mounting member it is placed under a compressive force load along vectors between opposing points on the perimeter of the panel (in the horizontal plane as shown in FIG. 1). This load causes the elastically deformable panel to deform into one of two stable states, described for sake of convenience as an upper or first stable position depicted in FIG. 1A and a lower or second stable position depicted in FIG. 1B. An SMA actuator member 16 is disposed between and connected to the upper face of the deformable panel 14 and lip portion 13 of the mounting member 12. Lip portion 13 of the mounting member provides a convenient location to which to connect SMA actuator member 16 and also serves to conceal the SMA actuator member for protection and aesthetic purposes, for example, when the device of FIGS. 1A and 1B is used as a push button.

The SMA actuator member 16 is shown in the exemplary embodiment of FIG. 1A in a bent memory or remembered shape. Where the FIG. 1 device is, for example, a push button, downward manual force exerted on the deformable panel 14 during the act of pushing the button causes the panel to move from its upper stable position shown in FIG. 1A through an unstable flat configuration to its lower stable position shown in FIG. 1B, deforming the SMA actuator member 16 to a straightened shape in the process. Heat can then be applied to the SMA actuator member, either from a heat source (not shown) or by applying an electric current through the SMA actuator member 16 to cause resistance heating. When heated, the SMA actuator member is urged to return to its remembered shape shown in FIG. 1A, thereby exerting an upward force on the deformable panel 14, causing it to return to the upper stable position shown in FIG. 1A. In another exemplary embodiment, the SMA actuator 16, instead of having a bent remembered shape, could be an SMA wire with a memorized length corresponding to the straight line distance between its mounting positions on lip portion 13 and deformable panel 14 in FIG. 1A. When the deformable panel is moved from its position in FIG. 1A to its position in FIG. 1B, the SMA wire would be stretched pseudoplastically to a longer length corresponding to the straight line distance between its mounting positions on lip portion 13 and deformable panel 14 in FIG. 1B. The deformable panel could then be returned to its position in FIG. 1A by heating the SMA wire to cause it to return to its memorized length from FIG. 1A. The SMA actuator 16 is depicted throughout the Figures herein with the exemplary embodiment alternating between the bent remembered shape and the deformed straight shape, but the exemplary embodiment with an SMA wire having a short remembered length and a longer deformed length could be used in any or all of the described embodiments as well.

Figure 2A:
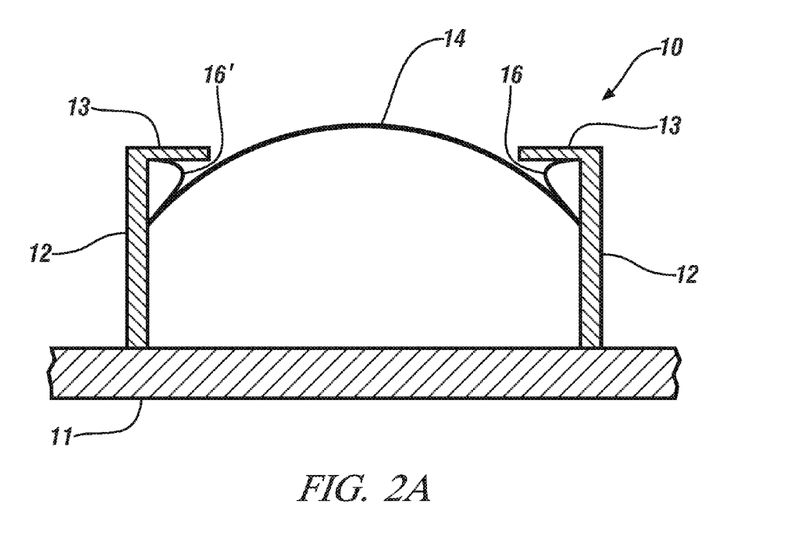
FIGS. 2A and 2B depict a schematic diagram of an exemplary bi-stable device having a circular deformable panel with two SMA actuator members capable of moving the panel from a second position to a first position.
Figure 2B:
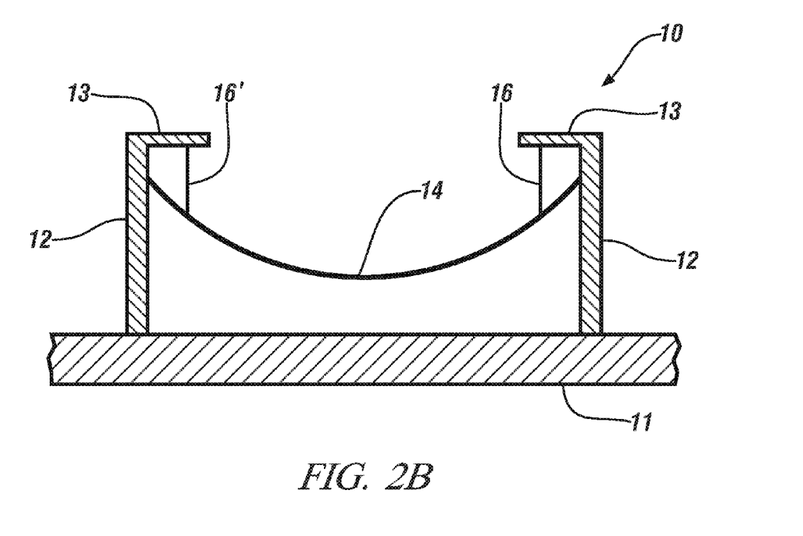

Turning now to FIGS. 2A and 2B, a similar reconfigurable bi-stable device with analogous components to the device of FIGS. 1A and 1B is shown. However, in FIGS. 2A and 2B, an additional SMA actuator member 16' is shown. The additional actuator member 16' can augment (provide more force) and help balance the upward force applied by SMA actuator member 16 to further enhance the capability to move the deformable panel 14 from its lower or second stable position as shown in FIG. 2B to its upper or first stable position as shown in FIG. 2A. As an alternative to, or in conjunction with increasing the force applied to the deformable panel by adding additional SMA actuator members, the resistance to deformation of the deformable panel can be controllably lowered upon heating through the use of a composite bi-stable device having a shape memory polymer in combination with the deformable panel, as described in U.S. patent application Ser. No. 13/250,248, filed on even date herewith under attorney docket number P016484-RD-MJL, entitled "Composite Bi-Stable Device", the disclosure of which is incorporated herein by reference in its entirety.

Figure 3A:
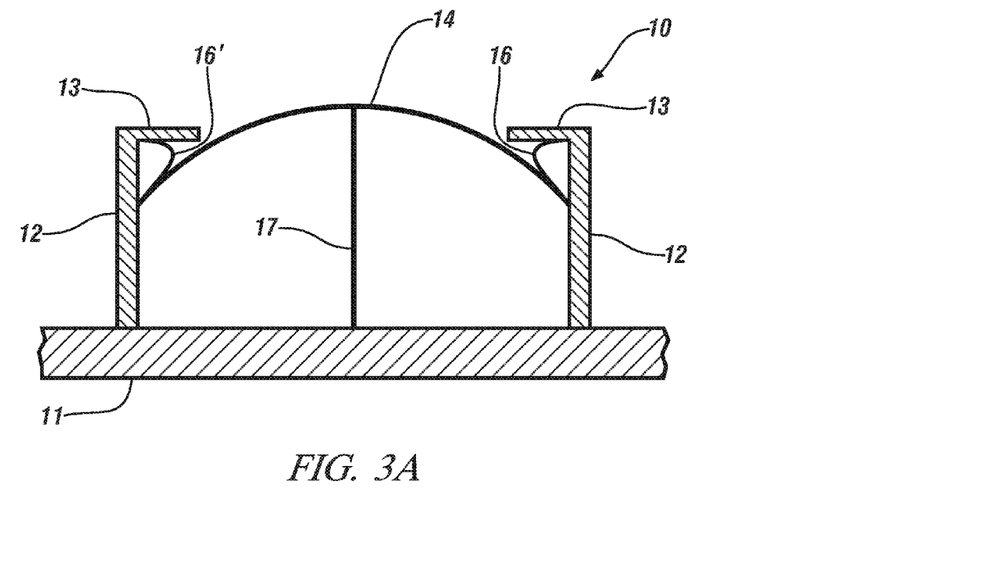
FIGS. 3A and 3B depict a schematic diagram of an exemplary bi-stable device having a deformable panel with two SMA actuator members capable of moving the panel from a second position to a first position and an SMA actuator member capable of moving the panel from the first position to the second position.
Figure 3B:
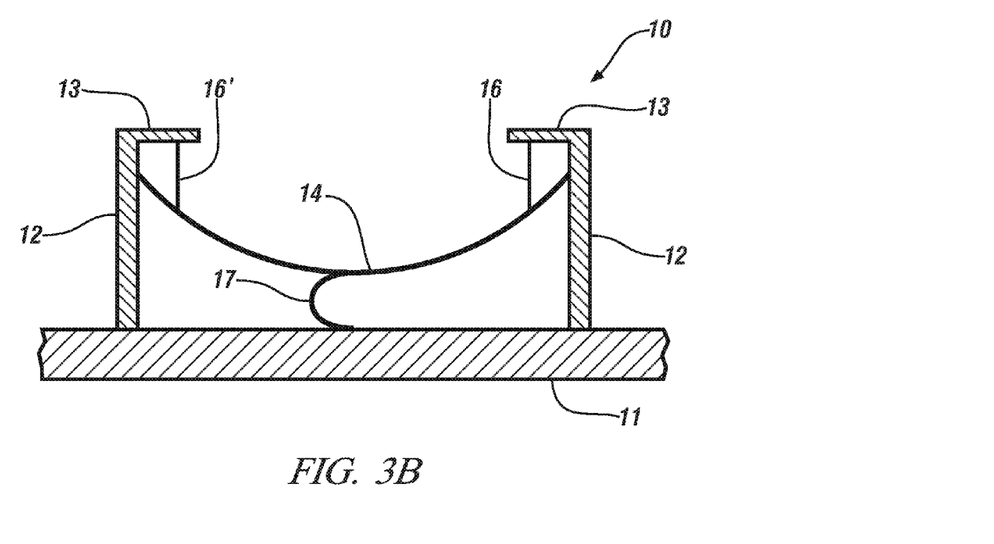

In some exemplary embodiments, it may be desirable to use an SMA or piezoelectric member to move the deformable member of a bi-stable device in either direction between the two stable positions of the device. In FIGS. 3A and 3B, a reconfigurable bi-stable device similar to the device of FIGS. 2A and 2B is shown, but with the addition of an SMA actuator member 17 attached to and connecting the lower face of deformable panel 14 to support structure 11. The SMA actuator member 17 is shown in FIG. 3B in a bent memory or remembered shape. Where it is desired to move the deformable panel from the upper or first stable position to the lower or second stable position without downward manually-applied force. In the exemplary embodiment of FIGS. 3A and 3B, heat can be applied to the SMA actuator member 17, either from a heat source (not shown) or by applying an electric current through the SMA actuator member to cause resistance heating. If a heat source is used instead of electric current, care should be taken to avoid also heating the actuator members 16, 16' to a temperature where they return to their memory shapes, as that would counteract the downward force applied by SMA actuator member 17. When heated, the SMA actuator member 17 is urged to return to its remembered shape shown in FIG. 3B, thereby exerting a downward force on the deformable panel 14, causing it to move to the lower stable position shown in FIG. 3B.

Figure 4A:
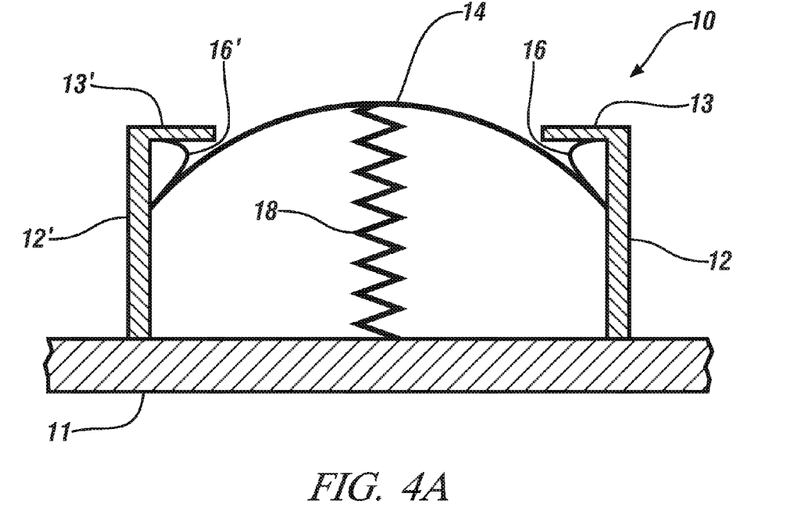
FIGS. 4A and 4B depict a schematic diagram of an exemplary bi-stable device having a rectangular deformable panel with two SMA actuator members capable of moving the panel from a second position to a first position and an elastic member capable of exerting additional force on the panel.
Figure 4B:
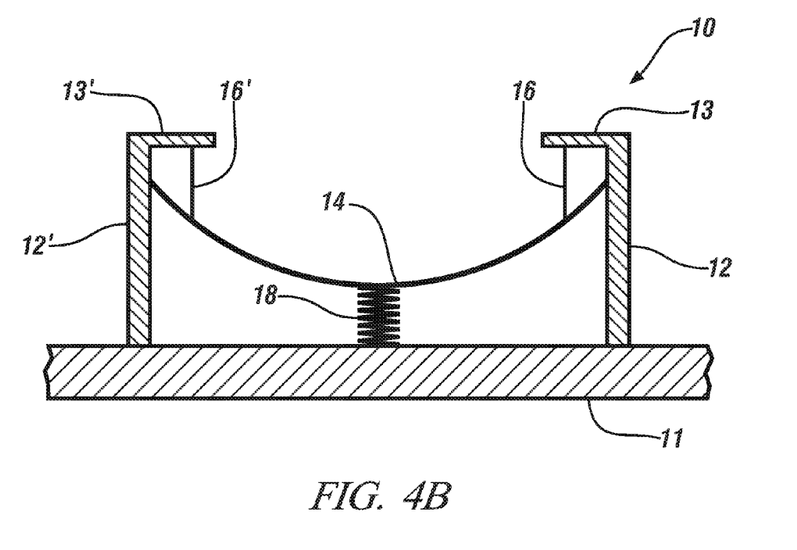

In another exemplary embodiment as shown in FIGS. 4A and 4B, an elastic member 18, disposed between and attached to the lower face of the deformable panel 14 and the support structure 11, is used to bias the position of the deformable panel 14 toward the upper stable position shown in FIG. 4A, the lower stable position shown in FIG. 4B, or from each of the upper and lower stable positions toward an unstable neutral position. FIG. 4 also depicts a configuration for a rectangular-shaped deformable panel 14, with left support member 12' having lip portion 13' distinctly identified from right support member 12 having lip portion 13. The elastic member 18 may be configured to bias the deformable panel toward the upper stable position where it is desired to augment the upward force applied by the SMA actuator members 16, 16' when they are heated. The elastic member 18 may also be configured to bias the deformable panel toward the lower stable position where resistance of the SMA actuator members 16, 16' to deformation during application of manual force during pressing of, for example, a push-button, causes an undesirable increase in the force required to press the push-button. In either case, the elastic member 18 should be configured to provide a level of biasing force that produces the desirable level of biasing without being so large as to prevent movement of the deformable panel 14 in the direction opposing the biasing force of the elastic member 18. In another exemplary embodiment, the elastic member 18 is in an expanded state in FIG. 4A and in a compressed state in FIG. 4B, being in a relaxed state when the deformable panel is in an unstable position somewhere between the positions of FIGS. 4A and 4B. In this embodiment, the elastic member 18 helps urge the deformable panel out of either of the stable positions of FIGS. 4A and 4B and helps provide a soft landing when the panel comes to rest in the other stable position.

Figure 5A:
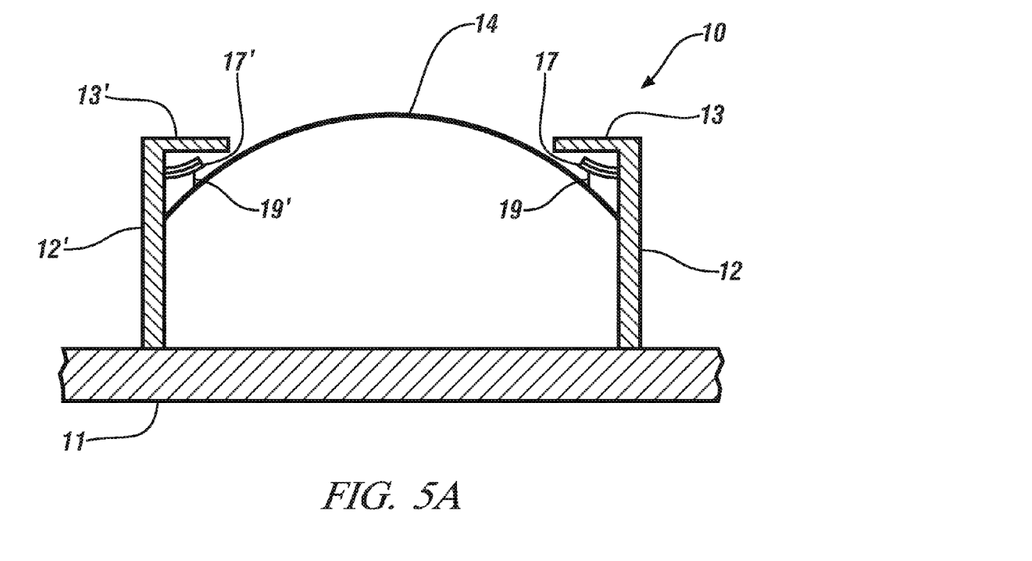
FIGS. 5A and 5B depict a schematic diagram of an exemplary bi-stable device having a rectangular deformable panel with two piezoelectric actuator members capable of moving the panel from a second position to a first position.
Figure 5B:
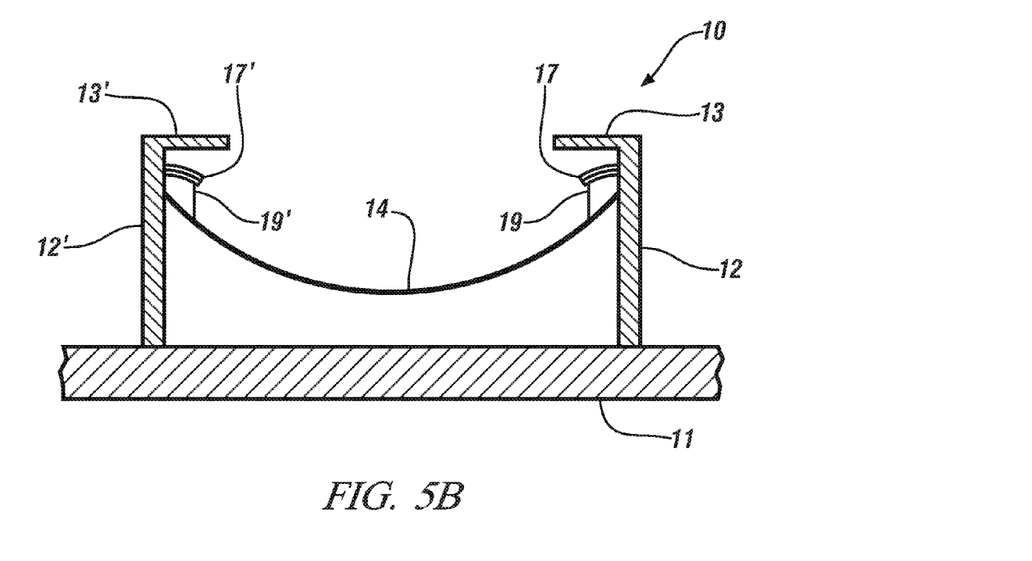

A piezoelectric actuator member may be used instead of an SMA actuator member to move the deformable panel 14 of the reconfigurable bi-stable device from a first position to a second position, or from a second position to a first position. Accordingly, FIGS. 5A and 5B depict a reconfigurable bi-stable device analogous to the device shown in FIGS. 2A and 2B, but with piezoelectric actuator members 17 and 17' connected to the upper face of deformable panel 14 by connecting members 19 and 19', respectively. The piezoelectric actuator member may be stimulated with an electrical field to cause deformation, thereby providing force to move the deformable panel 14 from one of its two stable positions to the other of its two stable positions. Similar to the placement of SMA actuator members, piezoelectric actuator members may be positioned at various locations around or above or below the deformable panel in order to provide sufficient force and/or balanced force to produce movement of the deformable panel, and/or to produce either one-way movement of the panel (from one stable position to the other stable position) or two-way movement of the panel (from either stable position to the other stable position).

Figure 6:
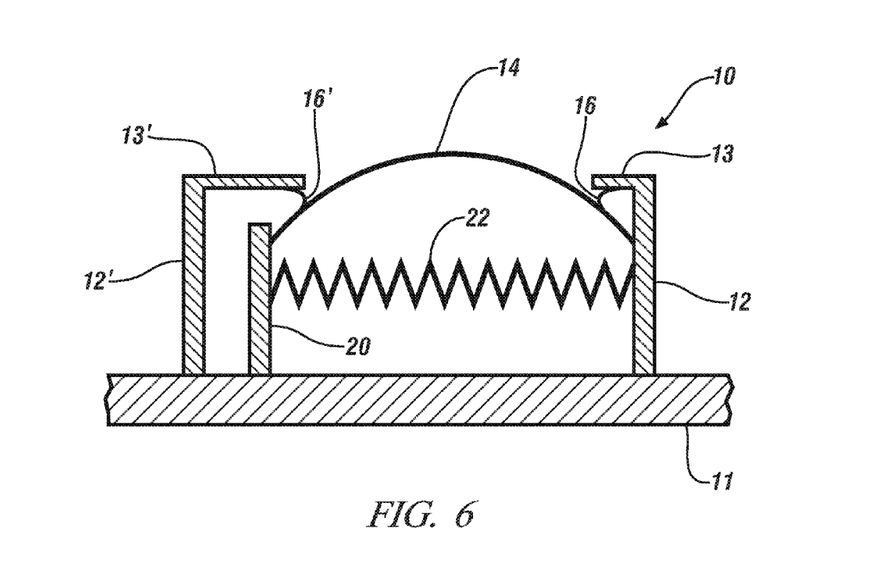
FIG. 6 depicts a schematic diagram of an exemplary bi-stable device having a rectangular deformable panel with two SMA actuator members capable of moving the panel from a second position to a first position and an elastic member applying load along a vector between two opposing ends of the panel.
Figure 7:
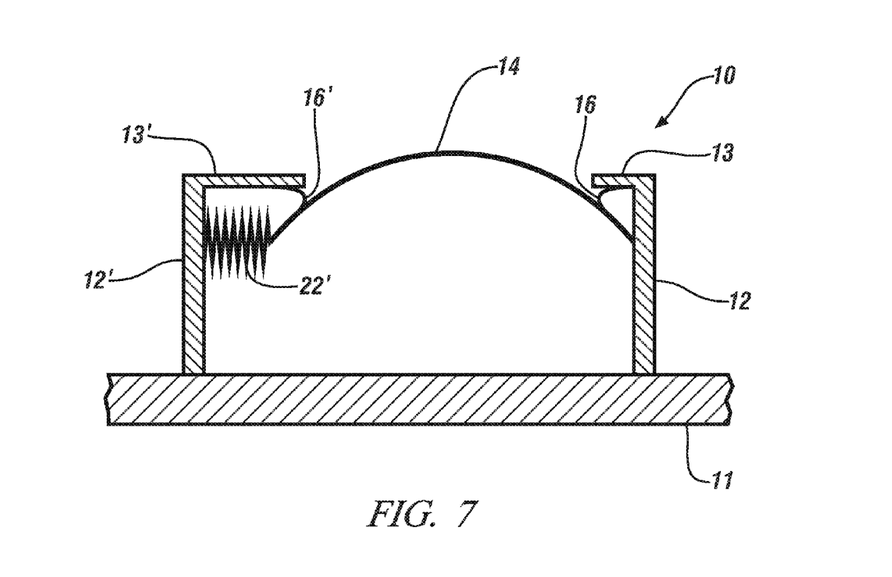
FIG. 7 depicts a schematic diagram of an exemplary bi-stable device having a rectangular deformable panel with two SMA actuator members capable of moving the panel from a second position to a first position and an elastic member applying load along a vector between two opposing ends of the panel.

FIGS. 6 and 7 depict exemplary embodiments similar to the reconfigurable bi-stable device of FIG. 2, but with the addition of an elastic member 22 to impart the horizontal (as shown in the exemplary embodiment of the Figure) load onto deformable panel 14 to cause it to deform into one of two stable positions. In FIG. 6, an elastic member 22 (e.g., a spring or other elastic member) is disposed between and connected to slidable member 20, which is slidably mounted on support structure 11, and mounting member 12. Elastic member 22 is configured so that it is in an expanded state, and thus urges slidable member 20 towards mounting member 12, thereby exerting a horizontal compressive load on the deformable panel to cause it to deform into one of two stable positions. In FIG. 7, an elastic member 22' is disposed between and connected to mounting member 12' and the left edge of deformable panel 14 (as viewed in the Figure). Elastic member 22' is configured so that it is in a compressed state, and thus exerts a horizontal compressive load on the deformable panel to cause it to deform into one of two stable positions. The use of an elastic member to impart the load across opposing ends of the deformable panel modifies the stress vs. strain performance of the deformable panel, thus providing further design options for the performance parameters of the reconfigurable bi-stable device. In other exemplary embodiments, the elastic member may itself be made of an SMA. In such embodiments, heating of the SMA elastic member (either from a heat source configured to avoid any undesired heating of other SMA components in the device or by applying electric current to the SMA elastic member) can cause it to return toward a remembered shape, thus providing a controllably variable load across opposing ends of the deformable panel. Two SMA elastic members (each urging the edge of the deformable panel in the opposite direction from one another) or a two-way SMA material can be used to provide the ability to controllably increase or decrease the horizontal compressive load on the deformable panel.

The devices of the exemplary embodiments described herein may be used in various applications, including but not limited to as push-buttons, as the walls in conduits to control/vary the flow therethrough, as variable position flow control (drag and lift) for exterior surfaces, for creating controllable/reversible interference fits such as desirable in the caps of medication containers and child safety locks, controllable sealing forces for swing panels—popped down for ease of opening and closing, popped up for enhanced perimeter sealing when panel closed. When they are used, for example, in push-button applications, the reconfigurable bi-stable devices allow for a position of a push-button to be actuated by system control (e.g., an electronic controller (not shown), electronically connected to the device 10 and configured to provide or to activate circuit(s) (not shown) to provide current to the piezo or SMA actuators or to activate a heater (not shown) to heat the SMA actuators in any of the Figures herein) in addition to being actuated by operator input (e.g., manual pressing of a button). System control actuation of a push-button enables the button position to provide a visual and/or tactile cue to the user of the operational state of a device being controlled by the button, as well as to actually change the operational state of the device being controlled by the button without the need for a system controller to override the operational state as set by the push-button (e.g., where the button is connected to an electromechanical control device such as an electrical switch).

For example, if a push-button has been configured to control the operational state of a motor vehicle rear-window defogger (either on or off), a reconfigurable bi-stable device as described herein could be used where manual pressing of the button moves the deformable panel 14 from the first or upper stable position to a second or lower stable position, thereby activating an electrical switch to close a circuit and activate the rear-window defogger. In order to prevent overheating and potential damage to the defogger components, such units are typically controlled by an auto shutoff controller or circuit that shuts the unit off after a predetermined period of time or if other conditions (e.g., high temperature) are reached. When the control circuit or electronic controller initiates the auto shutoff of the defogger (or any other device being controlled by the push-button), the SMA or piezoelectric actuator(s) can be activated to move the deformable panel from its second or lower stable position back to the first or upper stable position, thereby opening the circuit and deactivating the rear window defogger.

In other exemplary embodiments, it may be desirable to use SMA or piezoelectric actuator(s) to controllably move the deformable panel 14 in either direction between the first and second stable positions or between the second and first stable positions, such as with the device of FIG. 3. Again in the motor vehicle context (although clearly not limited to motor vehicle systems), many devices may be controllably activated and deactivated by controllers or control circuitry depending on inputs from various sensors. Vehicle headlights or other lighting systems may be controllably activated and deactivated depending on input from ambient light sensors, windshield wipers may be controllably activated and deactivated based on sensors that detect the presence of water droplets on the windshield, heating and cooling systems may be controllably activated or deactivated depending on input from temperature sensors, and many other examples of course exist or may be developed. For such systems, a device such as the one represented in FIG. 3 may be used where the controlled device may be activated either by manual pressing of the button moves the deformable panel 14 from the first or upper stable position to a second or lower stable position, or by system control from a controller activating the SMA actuator member 17 to move the deformable panel from the first or upper stable position to a second or lower stable position. The controlled device may be deactivated by system control from a electronic controller activating the SMA actuator members 16, 16' to move the deformable panel from the second or lower stable position to the first or upper stable position. Alternatively, user input could be used to deactivate the controlled device by using a touch sensor associated with deformable panel 14 to sense when it is pressed while in the second or lower position, which input would cause the electronic controller to actuate the SMA actuator members 16, 16' to move the deformable panel from the second or lower stable position to the first or upper stable position.

Various other exemplary embodiments disclosed herein can further enhance the available design and operation options for control devices like push-buttons. For example, when the elastic member 22 in the embodiments of FIGS. 6 and 7 comprises an SMA material, the shape memory capability of the elastic member can allow for the deformable panel 14 to assume different bi-stable configurations with different upper and lower stable positions. This exemplary device could thus be used to control devices with more than simple on-off controlled states (e.g., different speeds for a windshield wiper control) and the relative height of the stable positions of the deformable panel would represent the relative operational state of the controlled device. User input could be received from a touch sensor associated with the deformable panel followed by system response changing the position of the deformable panel by actuation of the SMA elastic member 22. In another exemplary embodiment, a push-button or touch pad may be designated to perform multiple different functions (e.g., numbers versus letters versus symbols on a mobile phone), and the relative height of the stable positions of the deformable panel 14 could be set to correspond to different functions assigned to the push-button or touch pad to serve as a visual and/or tactile cue of the currently assigned function.

Shape memory alloys useful for the SMA actuator members and SMA elastic members described herein are well-known in the art. Shape memory alloys are alloy compositions with at least two different temperature-dependent phases. The most commonly utilized of these phases are the so-called martensite and austenite phases. In the following discussion, the martensite phase generally refers to the more deformable, lower temperature phase whereas the austenite phase generally refers to the more rigid, higher temperature phase. When the shape memory alloy is in the martensite phase and is heated, it begins to change into the austenite phase. The temperature at which this phenomenon starts is often referred to as austenite start temperature ($A_s$). The temperature at which this phenomenon is complete is called the austenite finish temperature ($A_f$). When the shape memory alloy is in the austenite phase and is cooled, it begins to change into the martensite phase, and the temperature at which this phenomenon starts is referred to as the martensite start temperature ($M_s$). The temperature at which austenite finishes transforming to martensite is called the martensite finish temperature ($M_f$). It should be noted that the above-mentioned transition temperatures are functions of the stress experienced by the SMA sample. Specifically, these temperatures increase with increasing stress. In view of the foregoing properties, deformation of the shape memory alloy is preferably at or below the austenite transition temperature (at or below $A_s$). Subsequent heating above the austenite transition temperature causes the deformed shape memory material sample to revert back to its permanent shape. Thus, a suitable activation signal for use with shape memory alloys is a thermal activation signal having a magnitude that is sufficient to cause transformations between the martensite and austenite phases.

The temperature at which the shape memory alloy remembers its high temperature form when heated can be adjusted by slight changes in the composition of the alloy and through thermo-mechanical processing. In nickel-titanium shape memory alloys, for example, it can be changed from above about 100° C. to below about −100° C. The shape recovery process can occur over a range of just a few degrees or exhibit a more gradual recovery. The start or finish of the transformation can be controlled to within a degree or two depending on the desired application and alloy composition. The mechanical properties of the shape memory alloy vary greatly over the temperature range spanning their transformation, typically providing shape memory effect, superelastic effect, and high damping capacity. For example, in the martensite phase a lower elastic modulus than in the austenite phase is observed. Shape memory alloys in the martensite phase can undergo large deformations by realigning the crystal structure arrangement with the applied stress. As will be described in greater detail below, the material will retain this shape after the stress is removed.

Suitable shape memory alloy materials for fabricating the SMA actuator member(s) and/or SMA elastic member(s) described herein include, but are not intended to be limited to, nickel-titanium based alloys, indium-titanium based alloys, nickel-aluminum based alloys, nickel-gallium based alloys, copper based alloys (e.g., copper-zinc alloys, copper-aluminum alloys, copper-gold, and copper-tin alloys), gold-cadmium based alloys, silver-cadmium based alloys, indium-cadmium based alloys, manganese-copper based alloys, iron-platinum based alloys, iron-palladium based alloys, and the like. The alloys can be binary, ternary, or any higher order so long as the alloy composition exhibits a shape memory effect, e.g., change in shape, orientation, yield strength, flexural modulus, damping capacity, superelasticity, and/or similar properties. Selection of a suitable shape memory alloy composition depends on the temperature range where the component will operate.

As discussed above, in an exemplary embodiment, the actuator member(s) may also be piezoelectric actuator members. In general, piezoelectric materials exhibit small changes in dimensions when subjected to an applied voltage. Their response is proportional to the strength of the applied field and is quite fast being capable of easily reaching the thousand hertz range. Because their dimensional change is small (<0.1%), to dramatically increase the magnitude of dimensional change they are usually used in the form of piezoelectric uni-morph and bi-morph flat actuators that are constructed so as to bow into a concave or convex shape upon application of a relatively small voltage. The dimensional change of a piezoelectric actuator may still be smaller than that achievable by an SMA actuator, but the rapid morphing/bowing of such actuators can provide significantly faster response times (typically on the order of milliseconds) than achievable with current SMA's. Moreover, piezoelectric elements return automatically to their original geometry once the electric field is removed, which may reduce resistance to manual movement of the deformable panel compared to the SMA which remains in its bent memory shape or short memory length until it is forced to straighten.

Suitable piezoelectric materials include, but are not intended to be limited to, inorganic compounds, organic compounds, and metals. With regard to organic materials, all of the polymeric materials with non-centrosymmetric structure and large dipole moment group(s) on the main chain or on the side-chain, or on both chains within the molecules, can be used as suitable candidates for the piezoelectric film. Exemplary polymers include, for example, but are not limited to, poly(sodium 4-styrenesulfonate), poly(poly(vinylamine) backbone azo chromophore), and their derivatives; polyfluorocarbons, including polyvinylidenefluoride, its co-polymer vinylidene fluoride ("VDF"), co-trifluoroethylene, and their derivatives; polychlorocarbons, including poly(vinyl chloride), polyvinylidene chloride, and their derivatives; polyacrylonitriles, and their derivatives; polycarboxylic acids, including poly(methacrylic acid), and their derivatives; polyureas, and their derivatives; polyurethanes, and their derivatives; bio-molecules such as poly-L-lactic acids and their derivatives, and cell membrane proteins, as well as phosphate bio-molecules such as phosphodilipids; polyanilines and their derivatives, and all of the derivatives of tetramines; polyamides including aromatic polyamides and polyimides, including Kapton and polyetherimide, and their derivatives; all of the membrane polymers; poly(N-vinyl pyrrolidone) (PVP) homopolymer, and its derivatives, and random PVP-co-vinyl acetate copolymers; and all of the aromatic polymers with dipole moment groups in the main-chain or side-chains, or in both the main-chain and the side-chains, and mixtures thereof.

Piezoelectric material can also comprise metals selected from the group consisting of lead, antimony, manganese, tantalum, zirconium, niobium, lanthanum, platinum, palladium, nickel, tungsten, aluminum, strontium, titanium, barium, calcium, chromium, silver, iron, silicon, copper, alloys comprising at least one of the foregoing metals, and oxides comprising at least one of the foregoing metals. Suitable metal oxides include $SiO_2$, $Al_2O_3$, $ZrO_2$, $TiO_2$, $SrTiO_3$, $PbTiO_3$, $BaTiO_3$, $FeO_3$, $Fe_3O_4$, $ZnO$, and mixtures thereof and Group VIA and IIB compounds, such as CdSe, CdS, GaAs, $AgCaSe_2$, ZnSe, GaP, InP, ZnS, and mixtures thereof. Preferably, the piezoelectric material is selected from the group consisting of polyvinylidene fluoride, lead zirconate titanate, and barium titanate, and mixtures thereof.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the present application. The terms "front", "back", "bottom", "top", "first", "second", "third" are used herein merely for convenience of description, and are not limited to any one position or spatial orientation or priority or order of occurrence, unless otherwise noted.

The invention claimed is:

1. A reconfigurable bi-stable device, comprising:
an elastically deformable panel laterally disposed between and connected to one or more mounting members directly or indirectly connected to opposing ends of the panel, said panel maintained under compressive force along at least one vector extending between said opposing ends, said compressive force deforming the panel into a one of two stable deformed positions;
said device disposed such that the panel is movable between each of the two stable deformed positions by application of manual force to one of two opposing faces of the panel; and
a first shape memory alloy wire connected at a first end to a face of the panel and connected at a second end to the mounting member(s), said first shape memory alloy wire having a short remembered length and a long deformed length such that, upon heating, it moves the panel from a second one of the two stable deformed positions to a first one of the two stable deformed positions.

2. The device of claim 1, further comprising a second shape memory alloy wire connected at a first end to a face of the panel and connected at a second end to the mounting member(s), said second shape memory alloy wire having a short remembered length and a long deformed length such that, upon heating, it moves the panel from the first one of the two stable deformed positions to the second one of the two stable deformed positions.

3. The device of claim 1, comprising a plurality of shape memory alloy wires connected at first ends thereof to a face of the panel and connected at a second ends thereof to the mounting member(s), said plurality of shape me or alloy wires remembered length and a long deformed length such that, upon heating, they move the panel from the second one of the two stable deformed positions to the first one of the two stable deformed positions.

4. The device of claim 1, wherein said opposing ends of the panel are in a fixed position.

5. The device of claim 1, further comprising an elastic member disposed between and connecting one of the two opposing ends of the panel and a mounting member or disposed between and connecting two mounting members that are movable with respect to each other, said elastic member applying the compressive force deforming the panel into one of two stable deformed positions.

6. The device of claim 5, wherein the elastic member comprises a shape memory alloy.

7. The device of claim 1, further comprising an elastic member disposed between and connecting a face of the panel and a fixed member, said elastic member applying a force to the panel urging the panel from the one of the two stable deformed positions toward the other of the two stable deformed positions or toward an unstable position between the first and second stable deformed positions.

8. The device of claim 1, further comprising an electrical switch or sensor disposed in proximity to the panel and configured to generate or interrupt an electrical signal when the panel is moved from one of the first and second stable deformed positions to another of the first and second stable deformed positions.

9. The device of claim 1, further comprising a controller configured to actuate the first shape memory alloy wire to move the panel from the second one of the two stable deformed positions to the first one of the two stable deformed positions upon the occurrence of a predetermined condition or set of conditions.

10. The device of claim 2, further comprising a controller configured to actuate the first shape memory alloy wire to move the panel from the second one of the two stable deformed positions to the first one of the two stable deformed positions upon the occurrence of a first predetermined condition or set of conditions, and to actuate the second shape memory alloy wire to move the panel from the first one of the two stable deformed positions to the second one of the two stable deformed positions upon the occurrence of a predetermined condition or set of conditions.

* * * * *